(12) United States Patent
Kim et al.

(10) Patent No.: US 10,114,258 B2
(45) Date of Patent: Oct. 30, 2018

(54) NARROW BEZEL DISPLAY DEVICE

(71) Applicant: LG DISPLAY CO., LTD., Seoul (KR)

(72) Inventors: SangWoon Kim, Goyang-si (KR); SangHee Yu, Paju-si (KR); SungHyun Cho, Seoul (KR); SangGul Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 140 days.

(21) Appl. No.: 15/167,369

(22) Filed: May 27, 2016

(65) Prior Publication Data

US 2016/0349565 A1 Dec. 1, 2016

(30) Foreign Application Priority Data

May 31, 2015 (KR) ........................ 10-2015-0076972
May 16, 2016 (KR) ........................ 10-2016-0059666

(51) Int. Cl.
*G02F 1/1345* (2006.01)
*G02F 1/1339* (2006.01)
(Continued)

(52) U.S. Cl.
CPC ........ *G02F 1/13452* (2013.01); *G02F 1/1339* (2013.01); *G02F 1/13306* (2013.01); *G02F 1/13394* (2013.01); *G02F 1/13439* (2013.01); *H01L 27/3276* (2013.01); *H01L 51/5246* (2013.01); *G02F 2001/13398* (2013.01); (Continued)

(58) Field of Classification Search
CPC ............... G02F 1/1345; G02F 1/13452; G02F 1/13454; G02F 1/1339; G02F 1/13394; G02F 2001/13396; G02F 2001/13398; G02F 2001/13456; G02F 1/13306; H01L 27/124; H01L 27/3276; H01L 51/5246
See application file for complete search history.

(56) References Cited

U.S. PATENT DOCUMENTS

2007/0120152 A1* 5/2007 Chang ............... G02F 1/133345
257/270
2009/0296038 A1* 12/2009 Yoon ..................... G02F 1/1339
349/149

(Continued)

*Primary Examiner* — Jia Pan
(74) *Attorney, Agent, or Firm* — Birch, Stewart, Kolasch & Birch, LLP

(57) ABSTRACT

A display device according to an embodiment includes a lower substrate in which a display area and a non-display area are divided and an upper substrate which corresponds to the lower substrate and includes a black matrix BM. Further, the display device can include a bezel which is located on the non-display area and includes a GIP driver, a plurality of signal transmission lines, a connection line connecting the GIP driver and the plurality of signal transmission lines, and a seal area equipped with a sealant, in a direction being apart from one side of the display area, a plurality of bridge patterns which is located on the non-display area and electrically connects the GIP driver and the connection line, and the connection line and the plurality of signal transmission lines, respectively, and a plurality of shield patterns enclosing the plurality of bridge patterns. Also, the display device can include a plurality of shield patterns which minimize an area in which the sealant and the plurality of bridge patterns are in directly contact with each other.

30 Claims, 5 Drawing Sheets

(51) Int. Cl.
*G02F 1/133* (2006.01)
*H01L 27/12* (2006.01)
*H01L 51/52* (2006.01)
*H01L 27/32* (2006.01)
*G02F 1/1343* (2006.01)

(52) U.S. Cl.
CPC ........ *H01L 27/124* (2013.01); *H01L 27/3246* (2013.01); *H01L 51/5284* (2013.01); *H01L 2227/323* (2013.01)

(56) References Cited

U.S. PATENT DOCUMENTS

| | | | | |
|---|---|---|---|---|
| 2010/0163879 | A1* | 7/2010 | Jung | G02F 1/13454 |
| | | | | 257/59 |
| 2011/0291097 | A1* | 12/2011 | Ogasawara | G02F 1/1339 |
| | | | | 257/59 |
| 2013/0270582 | A1* | 10/2013 | Shin | H01L 33/48 |
| | | | | 257/88 |

* cited by examiner

NARROW BEZEL DISPLAY DEVICE

CROSS-REFERENCE TO RELATED APPLICATIONS

This application claims the priority of Korean Patent Application No. 10-2015-0076972 filed on May 31, 2015 and Korean Patent Application No. 10-2016-0059666 filed on May 16, 2016, in the Korean Intellectual Property Office, the disclosures of all these applications are incorporated herein by reference.

BACKGROUND

Field of the Invention

The present disclosure relates to a display device. More particularly, the present disclosure relates to a display device which can reduce a bezel width by disposing a sealant which bonds an upper substrate and a lower substrate, to extend to a signal line portion or a gate in panel (GIP) driver.

Description of the Related Art

As a display device, there are a liquid crystal display device and an organic electroluminescence display device configured to include an upper substrate, a lower substrate, where a liquid crystal layer or an organic light emitting device formed between two substrates. The liquid crystal display device is a device which displays an image by adjusting an alignment of the liquid crystal layer depending on whether an electric field is applied to adjust transmittance of light.

Generally, the organic electroluminescence display device (OLED) is classified into a passive matrix type OLED (PMOLED) and an active matrix type OLED (AMOLED) in accordance with a method of driving an organic light emitting device.

The AMOLED includes a plurality of gate electrode lines, a plurality of data lines, a plurality of power lines, and a plurality of pixels which is connected to the lines to be disposed in a matrix. Further, each pixel includes an organic light emitting device configured by an organic light emitting layer between an anode and a cathode and a pixel circuit which independently drives the OLED. The pixel circuit includes a switching transistor which mainly transmits a data signal, a driving transistor which drives the EL element in accordance with the data signal, and one capacitor which maintains a data voltage. The switching transistor charges the capacitor with the data voltage in response to a scan pulse. The driving transistor adjusts an emission amount of the OLED by controlling a current amount which is supplied to the OLED in accordance with the data voltage charged in the capacitor.

A sealant is applied in a seal area which is located in a non-display area (a bezel area) corresponding to an external peripheral portion of a display area of the display device. Therefore, the upper substrate and the lower substrate are bonded.

Recently, in order to satisfy various demands of a user and increase an esthetic sense, an effort to reduce a bezel width of a display device is continuously tried. As a bezel width in the display device is continuously reduced, a size of a seal area for bonding the upper substrate and the lower substrate of the display device needs to be reduced. However, when a width of the seal area is reduced, adhesiveness between the upper substrate and the lower substrate is correspondingly lowered.

In order to implement a narrower bezel width and reinforce the adhesiveness between the upper substrate and the lower substrate, the sealant may extend onto an external signal line formed in a non-display area of a panel and further onto a gate driver. However, some areas of a circuit in the non-display area may be formed of a material whose adhesiveness to the sealant is not strong. Therefore, even though the sealant extends to the circuit portion, the bonding problem between the upper substrate and the lower substrate may be caused due to weak adhesiveness. Further, the circuit unit which overlaps the sealant may be easily damaged by an external force applied to the panel. In this case, a foreign material permeates through the damaged portion to cause problems such as electro-chemical corrosion/corrosion of metal wiring lines. For example, a portion which is formed of ITO in a circuit region which overlaps the sealant not only has bad adhesiveness to the sealant but also is vulnerable to a crack by the external force. As a portion formed of the ITO in the region which overlaps the sealant is increased, a bonding problem of the panel is caused. When a crack is generated in the ITO portion, a permeating path of an external contamination source, such as moisture or salinity is formed to cause an electro-chemical corrosion/corrosion problem of the wiring lines of the panel.

As a result, the seal area needs to be designed to avoid a portion which has bad adhesiveness to the sealant or a portion which is easily damaged by an external force which is transmitted to the sealant. Therefore, there is a restriction to reduce the bezel by overlapping the seal area and the circuit unit.

SUMMARY

In order to solve the above-described problems and other limitations associated with the related art, an object of the present disclosure is to provide a display device in which a sealant has improved adhesiveness in a region where the seal area and the circuit unit overlap as compared with a structure of the related art, thereby reducing a bonding problem of the upper substrate and the lower substrate and also reducing a bezel width to a predetermined level or lower.

Further, another object of the present disclosure is to provide a display device which reduces electro-chemical corrosion/corrosion of a metal caused by a damaged circuit below the sealant in a region where the seal area and the circuit unit overlap, thereby reducing a bezel width to a predetermined level or lower.

Further, another object of the present disclosure is to provide a display device having a high degree of design/process freedom by providing a structure which reduces the electro-chemical corrosion/corrosion of a metal caused by a bonding problem of the upper substrate and the lower substrate and a damaged circuit below the sealant without additional avoidance design of the seal area and a specific circuit region and additional separate independent process or a mask, thereby reducing a bezel width of the display device.

According to an aspect of the present disclosure, there is provided a display device including a lower substrate in which a display area and a non-display area are divided; an upper substrate which corresponds to the lower substrate and includes a black matrix BM; a bezel which is located on the non-display area and includes a GIP driver, a plurality of signal transmission lines, a connection line connecting the GIP driver and the plurality of signal transmission lines, and a seal area equipped with a sealant, in a direction being apart from one side of the display area; a plurality of bridge patterns which is located on the non-display area and electrically connects the GIP driver and the connection line, and the connection line and the plurality of signal transmission lines, respectively; and a plurality of shield patterns enclosing each of the plurality of bridge patterns. Herein, the plurality of shield patterns minimizes an area in which the sealant and the plurality of bridge patterns are in directly contact with each other.

In order to achieve the above objects, another aspect of the present disclosure provides a liquid crystal display device, including: an upper substrate and a lower substrate which are disposed opposite to each other to interpose liquid crystal therebetween, a plurality of upper spacers which is equipped on the upper substrate, a plurality of lower spacers equipped on the lower substrate, a gate link unit in which a plurality of external signal lines is disposed, a GIP driver which is equipped with a shift register, a plurality of bridge areas which electrically connects the plurality of external signal lines and the GIP driver, a sealant equipped in a seal area which overlaps the gate link unit and a part of a GIP driver, and a bridge electrode which is disposed on a first contact hole through which a first metal layer is exposed and a second contact hole through which a second metal layer is exposed to connect the first metal layer and the second metal layer through the first contact hole and the second contact hole, in each of the plurality of bridge areas. Herein, some of the plurality of lower spacers may be disposed in a position corresponding to the upper spacer and the other of the plurality of the lower spacers may be disposed to overlaps at least one bridge area among the plurality of bridge areas.

In order to achieve the above objects, still another aspect of the present disclosure provides an organic light emitting display device, including: a substrate including a display areas in which a plurality of pixels equipped with an organic light emitting device is disposed and a non-display area, a bezel which is located on the non-display area and includes a GIP driver, a plurality of signal transmission lines, a connection line connecting the GIP driver and the plurality of signal transmission lines, and a seal area equipped with a sealant, in a direction being apart from one side of the display area, a plurality of bridge patterns which is located on the non-display area and electrically connects the GIP driver and the connection line, and the connection line and the plurality of signal transmission lines, respectively, and a plurality of shield patterns enclosing each of the plurality of bridge patterns.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENTS

Hereinafter, exemplary embodiments of the present disclosure will be described in detail with reference to the drawings.

Figure 1:
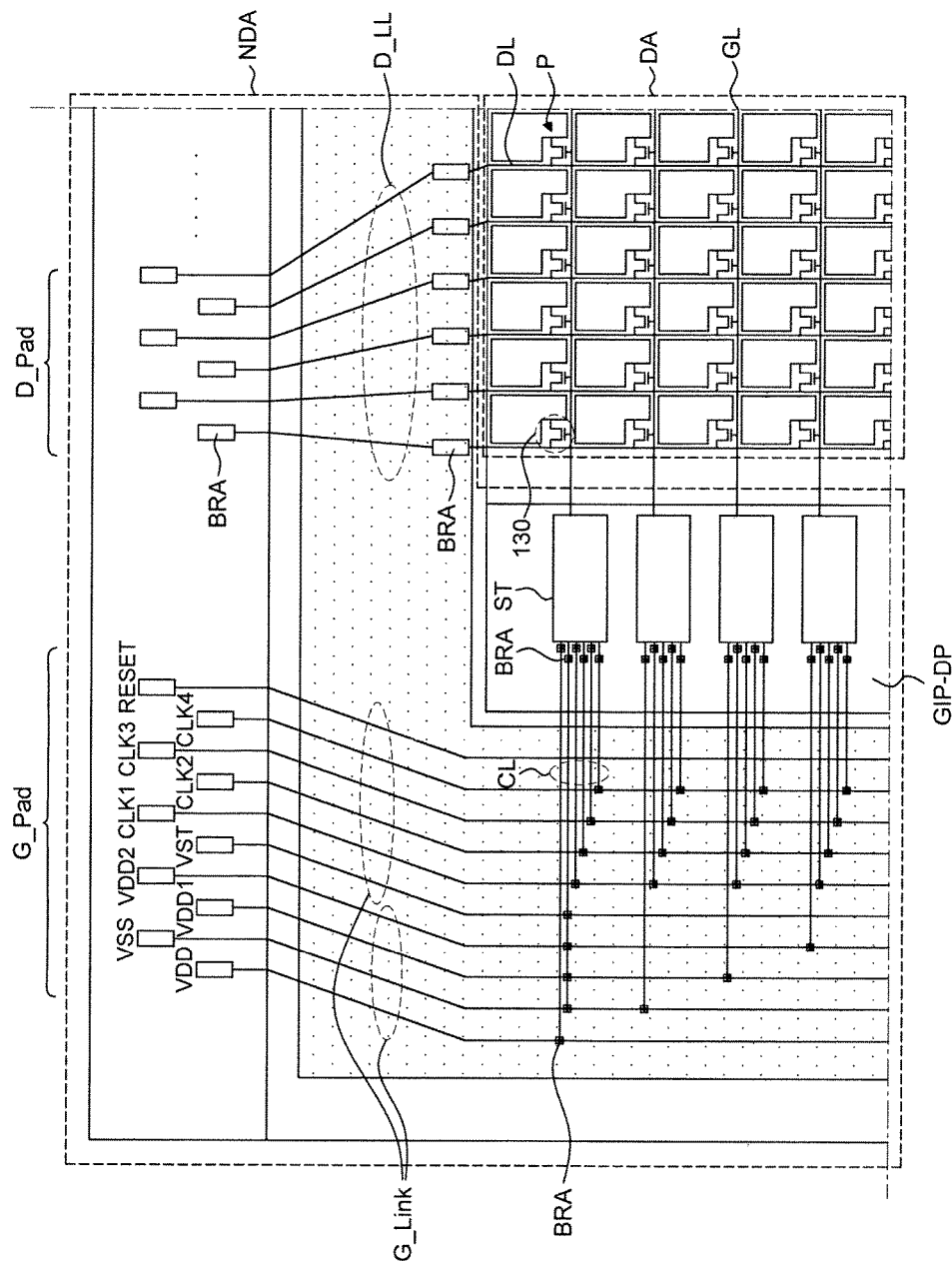
FIG. 1 is a schematic plane view of a display device according to an exemplary embodiment of the present disclosure.
Figure 2:
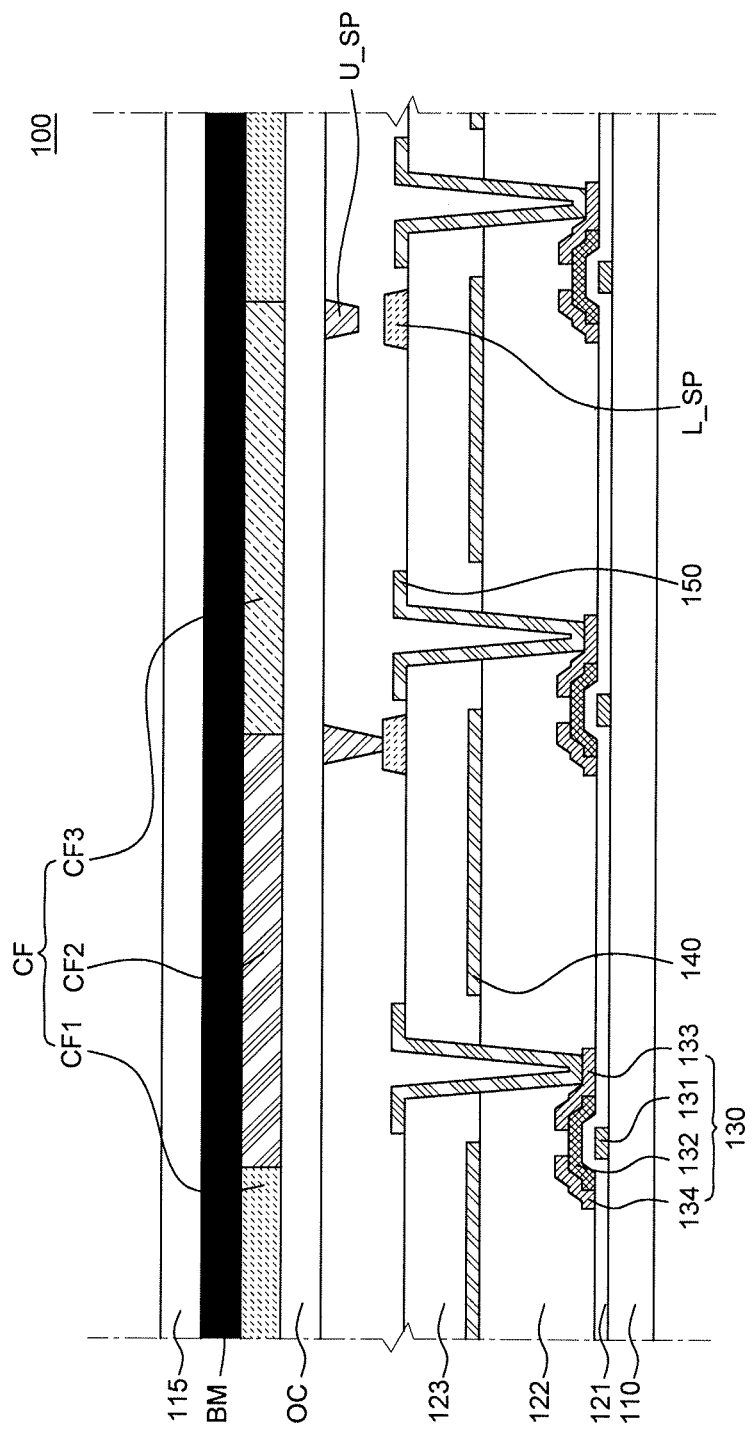
FIG. 2 is a schematic cross-sectional view of a pixel located in a display area of a display device according to an exemplary embodiment of the present disclosure.

FIG. 1 is a schematic plane view of a display device according to an exemplary embodiment of the present disclosure and FIG. 2 is a schematic cross-sectional view of a pixel located in a display area of a display device according to an exemplary embodiment of the present disclosure. All the components of the display device according to all embodiments of the present disclosure are operatively coupled and configured.

A display device includes a display panel 100 including a plurality of pixels P which outputs light. When the display panel 100 is embodied as a liquid crystal panel, the display panel 100 is configured by a structure in which liquid crystal LC is filled between a first substrate 110 (an upper substrate or a lower substrate) and a second substrate 115 (an upper substrate or a lower substrate). The first substrate 110 and the second substrate 115 are disposed opposite to each other and spaced apart from each other with a predetermined interval. In this case, one of the first substrate 110 and the second substrate 115 may be a TFT array substrate on which a plurality of thin film transistors (TFTs) is formed. The other substrate may be a color filter substrate on which color filters (CF) are formed to correspond to the plurality of pixels P. Further, both the color filter CF and the TFT array may be equipped in one of the first substrate and the second substrate. At least one of the first substrate and the second substrate includes a common electrode 140 and a pixel electrode 150. A vertical or horizontal electric field which is generated by a difference of voltages which are applied to the individual electrodes controls an alignment of liquid crystal LC located between the two substrates. The display device further includes a backlight device and a driving circuit unit. The backlight device is disposed below the liquid crystal panel and used as a light source. The driving circuit unit is located at an outer boundary of the liquid crystal panel and drives the liquid crystal panel. The driving circuit unit includes a GIP driver GIP-DP which is located in a non-display area NDA and is connected to a gate pad unit G_Pad which is formed on one side surface of the liquid crystal panel to drive a liquid crystal panel and a data driver which is located in a non-display area NDA and is connected to a data pad unit D-Pad which is formed on one surface of the liquid crystal panel. The data driver may be embodied on a printed circuit board (PCB).

Referring to FIGS. 1 and 2, a plurality of gate lines GL and a plurality of data lines DL intersect each other in a display area DA of the first substrate 110. A thin film transistor 130 is equipped in each pixel P defined by the gate lines GL and the data lines DL which intersect each other. For example, in the display panel 100, N gate lines GL and M data lines DL intersect to equip M×N pixels P. However, in some exemplary embodiments of the display panel 100, it is designed that adjacent pixels share the gate lines GL or the data lines DL, so that M×N or more pixels P may be equipped. The thin film transistor 130 equipped in each pixel P is connected to the gate line GL and the data line DL. Therefore, the thin film transistor 130 is switched in accordance with a gate signal which is applied from the gate line GL to supply a data signal applied from the data line DL, to the pixel electrode 150. The pixel electrode 150 is connected to the thin film transistor 130 to form an electric field in accordance with the data signal supplied from the thin film transistor 130 to rearrange the liquid crystal of the liquid crystal layer LC.

For convenience in explanation, in FIG. 2, only a red pixel, a green pixel, and a blue pixel are illustrated. The thin film transistor TFT formed in each pixel R, G, B includes a gate electrode 131, an active layer 132, a first electrode 134, and a second electrode 133 which are formed on the first substrate 110. Specifically, the gate electrode 131 which is electrically connected to the gate line GL is formed on the first substrate 110 and a gate insulating layer 121 is formed on the gate electrode 131. The active layer 132 in which a channel is formed is formed on the gate insulating layer 121. The first electrode 134 which is electrically connected to the data line DL and the second electrode 133 which is electrically connected to the pixel electrode 150 are formed on the active layer 132. The active layer 132 may be formed of amorphous silicon, polycrystalline silicon, an oxide semiconductor, or the like.

A flattening layer 122 is formed to cover the thin film transistor 130 on the first substrate 110 to form a flat surface above the thin film transistor 130. The flattening layer 122 may be formed of an organic insulating material such as photo-acryl (PAC), or the like. A separate passivation layer (PAS) may be equipped between the thin film transistor 130 and the flattening layer 122. The passivation layer which is equipped between the thin film transistor 130 and the flattening layer 122 may be a silicon-based inorganic material.

A common electrode 140 is formed on the flattening layer 122. The common electrode 140 drives the liquid crystal by forming an electric field corresponding to the pixel electrode 150. In FIG. 2, it is illustrated that the pixel electrode 150 is electrically connected to the second electrode 133 of the thin film transistor 130 through a contact hole. Therefore, the common electrode 140 is illustrated to be separated in each pixel. However, the common electrode 140 is equipped over the plurality of pixels P as a single pattern in which the common electrode 140 is continuous in a region except a region where the pixel electrode 150 and the thin film transistor 130 are connected through a contact hole. The common electrode 140 may be electrically connected to a common electrode line through a separate contact hole.

Further, the common electrode 140 may be divided into a plurality of common electrode blocks and may be configured to have a structure in which a plurality of pixels P shares one common electrode block. In this case, a period of one frame of a screen is time-divided to apply a signal for sensing a touch input to the common electrode line for one period, thereby implementing a display panel 100 which can recognize touch. Each common electrode block may be connected to individual common electrode lines. In this case, the common electrode line at least partially overlaps the gate line GL or the data line DL to be extended. The common electrode 140 may be disposed below the thin film transistor 130. When the common electrode 140 is disposed below the thin film transistor 130, an additional flattening layer which is different from the flattening layer 122 which is formed above the thin film transistor 130 may be provided between the common electrode 140 and the thin film transistor 130. For example, a plurality of common electrodes 140 may be formed above the first substrate 110. A silicon-based flattening layer (silicon on glass: SOG) may be formed above the common electrode lines and the thin film transistor 130 may be formed above the flattening layer.

An insulating layer 123 is formed between the common electrode 140 and the pixel electrode 150 in order to insulate the two electrodes from each other. The insulating layer 123 protects the common electrode 140 and flattens an upper portion of the common electrode 140. The insulating layer 123 may be formed of the same material as the flattening layer 122 or may be formed of an insulating material different from the flattening layer 122.

The pixel electrode 150 is electrically connected to the first electrode 134 of the thin film transistor 130 through a contact hole which is formed in the flattening layer 122 and the insulating layer 123. The pixel electrode 150 and the common electrode 140 may be formed of a transparent conductive material (for example, ITO). A plurality of slits may be formed in the pixel electrode 150 to form a horizontal electric field together with the common electrode 140. However, a structure and a disposing relationship between the common electrode 140 and the pixel electrode 150 are not limited thereto. Accordingly, in some exemplary embodiments, the common electrode 140 may be disposed above the pixel electrode 150 or the pixel electrode 150 and the common electrode 140 may be disposed on the same layer. Further, in some exemplary embodiments, instead of the pixel electrode 150, the common electrode 140 may have a plurality of slits.

In the exemplary embodiment illustrated in FIG. 2, the second substrate 115 which is disposed to be opposite to the above-mentioned first substrate 110 is a color filter substrate of the display panel 100. The second substrate 115 includes a black matrix BM which defines the plurality of pixels P as a light shielding area and an aperture area and a color filter layer CF. An area where the black matrix BM is formed is defined as a light shielding area and a region where the black matrix BM is not formed is defined as an aperture area. In the light shielding area by the black matrix (BM), various driving elements and wiring lines such as the thin film transistor 130, the data line DL, the gate line GL, or the like are formed. In the area defined as the aperture area, the pixel electrode 150 and the common electrode 140 are formed. In FIG. 2, a cross-section which is taken along the gate line GL of the display panel 100 is illustrated, so that the black matrix BM is continuously extended. However, in the aperture area, the black matrix BM is disposed between two adjacent pixels to block the data line DL, the thin film transistor 130 or a structure which reflects external light therebelow.

On the second substrate 115, a color filter layer CF is formed to correspond to the pixels of the display panel 100. Specifically, color filters CF1, CF2, and CF3 are respectively formed to correspond to aperture areas of the red pixel, the green pixel, and the blue pixel. Partial areas of the color filters CF1, CF2, and CF3 may respectively overlap the black matrix BM. In the exemplary embodiment illustrated in FIG. 2, the black matrix BM is disposed to be closer to the second substrate 115 than the color filters are. However, in some other exemplary embodiments, in order to reduce leakage of light between adjacent pixels P, the color filters CF1, CF2, and CF3 may be formed to be closer to the second substrate 115 and the black matrix BM may be formed on a surface of the color filter layer CF. Here, the surface of the color filter layer CF refers to a surface which faces the first substrate 110 and is close to the first substrate 110, among the surfaces of the color filter CF.

An overcoat layer OC is formed on the second substrate 115 to cover the black matrix BM and the color filter layer CF. The overcoat layer OC is a layer which provides a flat surface from the second substrate 115 on which the black matrix BM and the color filter layer CF are formed to an opposite side to the first substrate 110. The overcoat layer 124 may be formed of the same material as the flattening layer 122.

Referring to FIG. 2, a spacer is equipped between the first substrate 110 and the second substrate 115 to maintain a constant interval between the two substrates. When external force is applied to the display panel 100, the spacer may move in all directions.

In this case, the moving spacer may damage an alignment layer equipped on a surface of the substrate which faces the liquid crystal layer LC. Therefore, the liquid crystal alignment is unintentionally disordered and thus light is leaked. The leaked light may cause light leakage problem such that a black image of the display panel 100 has a reddish color, a greenish color, or a bluish color depending on a position where the spacer is formed.

In order to reduce the light leakage in accordance with the movement of the spacer as described above, the size of the black matrix BM may be enlarged based on the spacer formed position. However, it may hinder to achieve high resolution and high aperture ratio in the display panel. Therefore, in the display panel 100 of this disclosure, a plurality of spacers is equipped in each of the first substrate 110 and the second substrate 115.

Referring to FIG. 2, a plurality of upper spacers U_SP is disposed on the overcoat layer OC of the second substrate between the first substrate 110 and the second substrate 115. The upper spacers U_SP are formed in the light shielding area where the black matrix BM is formed. Lower spacers L_SP are equipped on a top surface of the insulating layer 123 of the first substrate 110 between the first substrate 110 and the second substrate 115 so as to correspond to the upper spacers U_SP disposed on the second substrate 115.

Some of the plurality of spacers equipped on each of the first substrate 110 and the second substrate 115 may be formed to be longer or shorter than the other spacers. For example, as illustrated in FIG. 2, some upper spacers among the upper spacers U-SP may be formed to be longer than other upper spacers U_SP. That is, a distance between some of upper spacers U_SP and corresponding lower spacers L_SP may be shorter than a distance between the other upper spacers U_SP and corresponding lower spacers L_SP.

Similarly, some of the lower spacers L_SP may be longer than the other lower spacers L_SP. The upper spacers U_SP which are formed to be longer than other spacers as described above maintains a cell gap of the display panel 100. For example, heights of the lower spacers L_SP and the upper spacers U_SP which maintain the cell gap between the first substrate 110 and the second substrate 115 may allow a top surface of the lower spacer L_SP and a bottom surface of the upper spacer U_SP to be in contact with each other.

A spacer which is formed to be shorter than other spacers formed on the same substrate to have a large distance to the corresponding spacer of the opposite substrate maintains flexibility of the display panel 100 when an external pressure is applied to the display panel 100. Further, the spacer may suppress the distance between the two substrates from being smaller than a predetermined distance.

Further, the upper spacer U_SP and the lower spacer L_SP are implemented to have a bar shape. The bar shaped upper spacer U_SP and lower spacer L_SP may be formed in the light shielding area by the black matrix BM disposed along the gate line GL. The upper spacer U_SP overlaps the gate line GL and extends in the same direction as an extending direction of the gate line GL. The lower spacer L_SP which is formed in a position corresponding to the upper spacer U_SP overlaps the data line DL on the first substrate 110 and extends in the same direction as an extending direction of the data line DL.

The upper spacer U_SP may extend along the gate line GL so as not to pass over the contact holes of two adjacent pixels P. However, the length of the upper spacer U_SP is not limited thereto and the upper spacer may extend along the gate line GL to pass over the contact holes of the plurality of pixels.

The upper spacer U_SP and the lower spacer L_SP are formed in the light shielding area by the black matrix BM disposed along the gate line GL The upper spacer U_SP extends in the same direction as the extending direction of the data line DL to overlap the data line DL. The lower spacer L_SP which is formed in a position corresponding to the upper spacer U_SP extends in the same direction as an extending direction of the gate line GL to overlap the gate line GL, on the first substrate 110. When the upper spacer U_SP moves by the external pressure to be located above the contact hole, the upper spacer U_SP may not return to its original position even when the external pressure is removed from the display panel 100. Therefore, the upper spacer U_SP may be formed to be longer than an area of the contact hole so that the upper spacer U_SP does not fall into the contact hole.

In other way, the lower spacer L_SP may further extend along the gate line GL to cover the plurality of contact holes. The lower spacer L_SP may be formed on the entire surface along the gate line GL. When the lower spacer L_SP is formed on the entire surface of the gate line GL, it may be difficult to optimize an amount of the liquid crystal layer LC between the first substrate and the second substrate. Therefore, the lower spacer L_SP may be formed to cover only a specific number of contact holes which are adjacent to each other. For example, the lower spacer L_SP may be formed to have a length enough to cover only two contact holes which are adjacent to each other.

The upper spacer U_SP and the lower spacer L_SP may be formed to have a circular shape which is different from the bar shape. The upper spacer U_SP and the lower spacer L_SP are formed in the light shielding area by the black matrix BM disposed along the gate line GL. The upper spacer U_SP has a cone shape which becomes narrower toward the first substrate 110 from the second substrate 115. The lower spacer L_SP which is opposite to the upper spacer U_SP extends in the same direction as an extending direction of the gate line GL to overlap the gate line GL, on the first substrate 110. In this case, some of the lower spacers L_SP corresponding to the upper spacer U_SP may have a circular shape whose diameter is larger than a diameter of the upper spacer U_SP. Further, the lower spacer L_SP may be formed along the gate line GL to cover the contact holes of the plurality of pixels or cover only contact holes of two pixels which are adjacent to each other.

The upper spacer U_SP and the lower spacer L_SP may be formed of an organic material or an inorganic material. However, when the upper spacer U_SP and the lower spacer L_SP are formed of the organic material, it is easier to adjust the height and the shape of the spacer. For example, the upper spacer U_SP and the lower spacer L_SP may be formed of an organic material, such as photo acryl (PAC), polyimide (PI), or the like. In order to secure a distance spaced between the upper spacer U_SP and the alignment layer on the second substrate 115, the height of the lower spacer L_SP may be 4000 A or larger.

In accordance with the above-described structure of the upper spacer U_SP and the lower spacer L_SP and the disposition between two spacers, even though the external force is applied to the display panel 100, the upper spacer U_SP and the lower spacer L_SP are not in contact with the alignment layer, so that the light leakage problem caused by the damaged alignment layer may be suppressed. Therefore, the size of the black matrix BM which is set to reduce the image quality problem caused by the light leakage problem is reduced, thereby implementing a display panel 100 having an improved aperture ratio and a high resolution.

Referring to FIG. 1, a narrow bezel display device according to an exemplary embodiment of the present disclosure includes a pad unit PAD, a data link unit D_Link, a gate link unit G_Link, a connection line CL, a bridge area BRA, a shield pattern, a seal area, and a GIP driver GIP-DP in a non-display area NDA of the first substrate 110.

The pad unit PAD includes a data pad unit D_Pad and a gate pad unit G_Pad. The gate pad unit G_Pad is formed at one side of the data pad unit D_Pad to be connected to an external driving circuit unit. The data pad unit D_Pad is formed at one side of the non-display area NDA of the first substrate 110 to be connected to an external driving circuit unit. Further, in the data pad unit D_Pad, a data driver having an integrated circuit (IC) structure is disposed to be directly connected to the first substrate 110 in a chip-on-glass (COG) manner.

The pad unit PAD may be equipped with pads which drive the pixel P of the display panel 100 or input/output a signal required to implement various additional functions, in addition to the data pad unit D_Pad and the gate pad unit G_Pad which have been described above. For example, a common voltage pad unit which is connected to a common voltage generating unit of the driving circuit unit or a touch sensor pad which is connected to a touch driver to perform a touch recognizing function of the display panel may be equipped. The positions of the pad units described above are not limited to an upper side of the non-display area NDA as illustrated in FIG. 1. That is, the pad units may be equipped at the other side of the non-display area NDA or at a plurality of sides thereof.

The data link unit D_Link is equipped with a data link line D_LL which is extended between the data line DL disposed in the display area DA and the data pad unit D_Pad to electrically connect the data line DL and the data pad unit D_Pad.

The gate link unit G_Link is equipped with signal transmission lines to which external signals are supplied to drive the GIP driver GIP-DP. For example, as illustrated in FIG. 1, the gate link unit G_Link may be equipped with a plurality of signal transmission lines which transmits a gate start signal VST, a plurality of clock signals CLK1, CLK2, CLK3, and CLK4, a reset signal RESET, a plurality of voltages VSS, VDD, and VDD1, or the like. Any one of line of the plurality of signal transmission lines of the gate link unit G_Link may be formed of the same material as a gate electrode of the thin film transistor 130.

The connection line CL connects each signal transmission line of the gate link unit G_Link which is electrically connected to the gate pad unit G_Pad and the GIP driver GIP-DP. Therefore, in the non-display area NDA, each signal transmission line of the gate link unit G_Link is in contact with the connection line CL and the connection line CL is in contact with the GIP driver GIP-DP. The connection line CL may be configured by the same material as the source/drain of the thin film transistor 130.

The GIP driver GIP-DP is configured in a gate-in-panel (GIP) manner by the thin film transistors 130 which are formed in the non-display area NDA of the first substrate 110 during a process of forming the thin film transistor 130 of the pixel P described above. The GIP driver GIP-DP generates gate signals to sequentially supply the gate signals to the gate lines GL disposed in the display area DA. To this end, the GIP driver GIP-DP includes a plurality of stages ST which is connected to the gate lines GL. Therefore, each external signal line of the gate link unit G_Link is selectively connected to the stages ST of the GIP driver GIP-DP through the connection line CL.

Each of the plurality of stages ST supplies any one of a plurality of clock signals CLK1, CLK2, CLK3, and CLK4 to the gate line GL as a gate signal, in response to a gate start signal which is supplied from the gate start signal VST or a previous stage. Each of the plurality of stages ST sequentially operates in accordance with the gate start signal which is supplied from the gate start signal VST or the previous stage. Therefore, the gate signals are supplied sequentially from the first gate line GL to the last gate line GL or sequentially from the last gate line GL to the first gate line GL.

A bridge area BRA includes a bridge pattern BRP which allows each signal transmission line of the gate link unit G_Link and the connection line CL to be in contact with each other. Further, the bridge pattern BRP allows the connection line CL and the GIP driver GIP-DP to be in contact with each other.

The bridge pattern BRP is located in the data signal line and the display area and is used to allow the data lines which transmit a data voltage to the pixel, to be in contact with each other.

A seal area includes a sealant which is formed at an outer boundary portion of the display area DA along the non-display area NDA at edges of the first substrate 110 and the second substrate 115 to bond the first substrate 110 and the second substrate 115 to be opposite to each other with the liquid crystal layer LC therebetween. An image is not displayed in the seal area and the non-display area NDA of the first substrate 110, so that the seal area and the non-display area are blocked by a housing of the display device. In this case, a portion which is blocked by the housing is also referred to as a bezel. In order to reduce a width of the bezel, the seal area overlaps a part of the gate link unit G_Link described above or may further overlap a region where the connection line CL is disposed or the GIP driver GIP-DP is formed.

In the display device, as the bezel width is continuously reduced, a size of the seal area which bonds the upper substrate and the lower substrate of the display device may be reduced. However, when the width of the seal area is reduced, an adhesiveness between the upper substrate and the lower substrate is also weakened.

Referring to FIG. 1, in the display device according to the exemplary embodiment of the present disclosure, in order to implement smaller bezel width and reinforce an adhesiveness of the upper substrate and the lower substrate, the sealant may be disposed to extend onto the plurality of signal transmission lines of the gate link unit formed in the non-display area of the panel and the connection line CL, and further onto a part of the GIP driver GIP-DP.

However, the gate link unit and the connection line CL, or the GIP driver GIP-DP may be formed of a material which has a poor adhesiveness to the sealant. Therefore, even though the sealant extends onto the plurality of signal transmission lines of the gate link unit and the connection line CL, or onto the part of the GIP driver GIP-DP, the bonding problem between the upper substrate and the lower substrate may be caused due to weakened adhesiveness.

In the non-display area, a shield pattern which improves the bonding problem may be equipped. The shield pattern located in the non-display area may be simultaneously formed with a spacer which is located in the display area and constantly maintains an interval between the first substrate 110 and the second substrate 115. The shield pattern may be formed of polyimide PI or a photo-acryl PAC.

Further, the line and the driver which are located in the non-display area and overlap the sealant may be easily broken by an external force which is applied to the panel. In this case, external material enters through the broken portion to cause electro-chemical corrosion/corrosion of the metal lines. For example, the bridge pattern BRT formed of ITO, in the line area overlapping the sealant, has a poor adhesiveness to the sealant and is vulnerable to the crack by the external force. As the area formed by the bridge pattern BRP is increased in the area overlapping the sealant, the bonding problem of the panel is caused. Further, when a crack is generated in the bridge pattern area, a penetration path of an external contamination source such as moisture or salt is formed, which causes electro-chemical corrosion/corrosion of lines of the panel. Therefore, in the display device according to the exemplary embodiment of the present disclosure, the shield pattern can improve the adhesiveness of the sealant and the bridge pattern BRP and minimize a crack generated in the bridge pattern.

Figure 3:
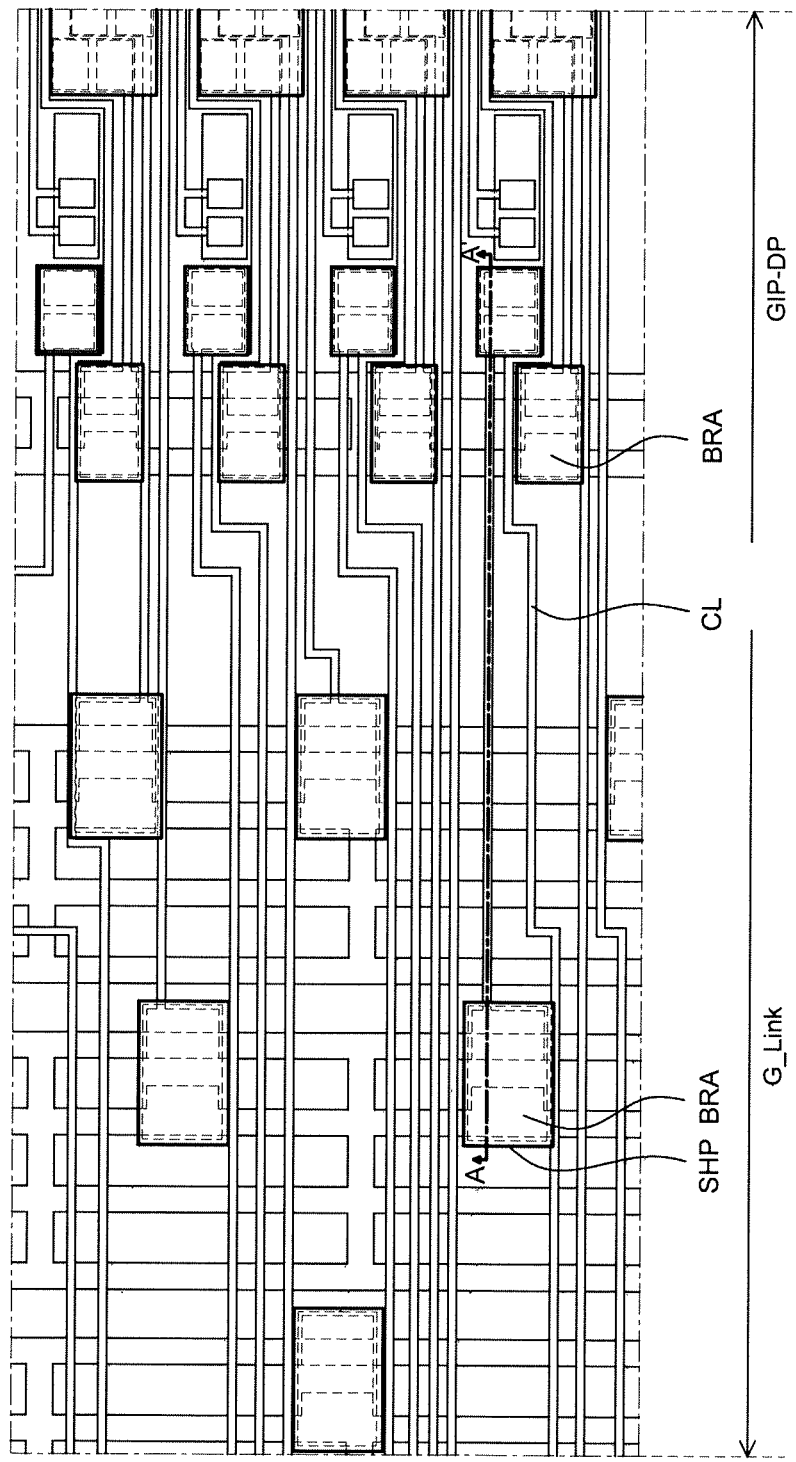
FIG. 3 is an enlarged plane view of a part of a non-display area of a display device according to an exemplary embodiment of the present disclosure.
Figure 4A:
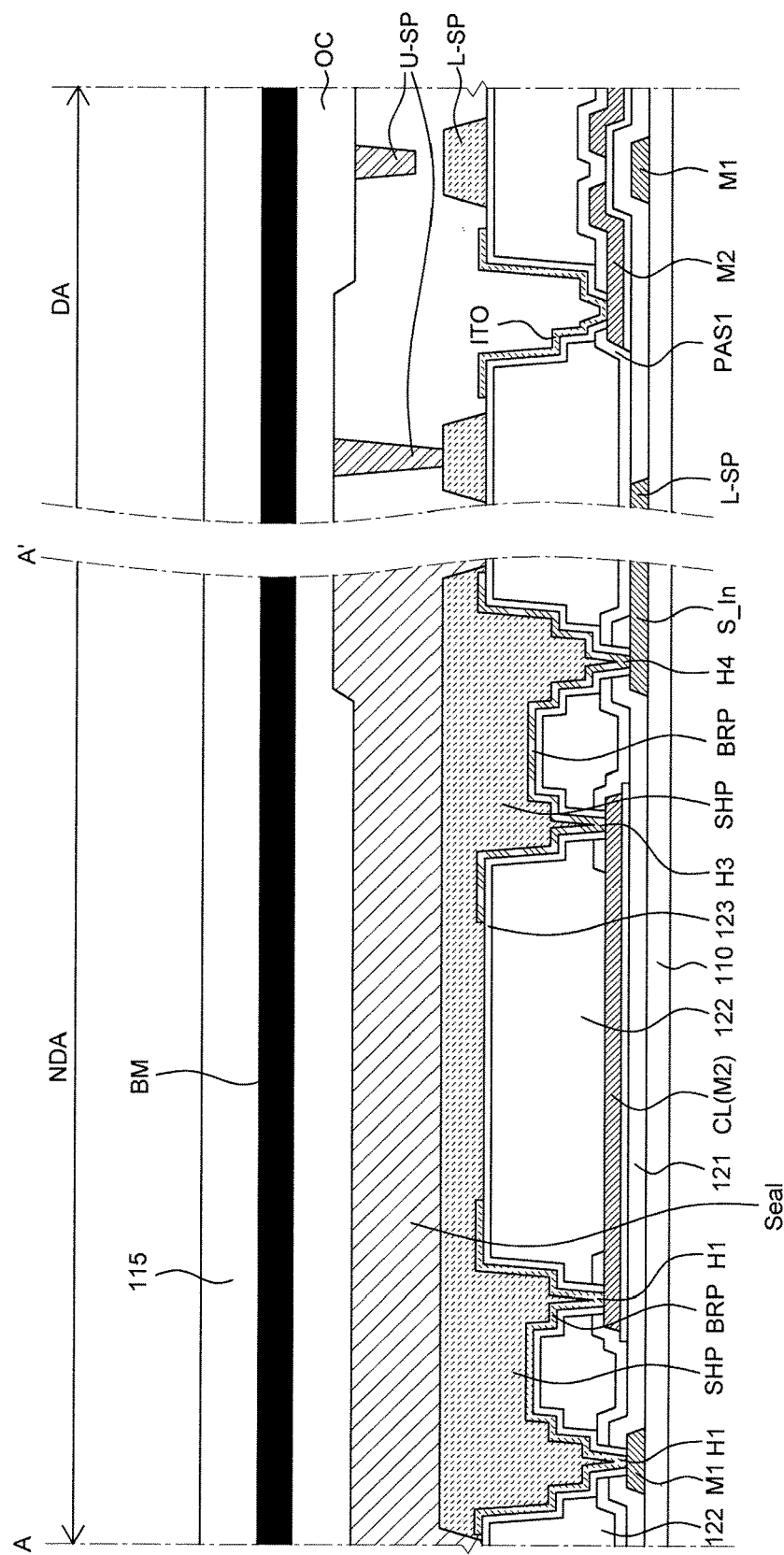
FIG. 4A is a cross-sectional view taken along the line A-A' of FIG. 3.

FIG. 3 is a plane view enlarging a part of a non-display area of a display device according to an exemplary embodiment of this disclosure. FIG. 4A is one example of a cross-sectional view taken along the line A-A' illustrated in FIG. 3.

FIG. 3 is a plane view enlarging that each signal transmission line of a gate link unit G_Link and the connection line CL are in contact with each other and the connection line CL and the GIP driver GIP-DP are in contact with each other, in the non-display area NDA. FIG. 4A is a cross-sectional view schematically illustrating a part of the display area DA and the non-display area NDA of the display panel 100 taken along a line extending from a point A to a point A' illustrated in FIG. 3.

Referring to FIG. 3, a gate link unit G_Link including a plurality of signal transmission lines is formed toward an outer boundary of the first substrate 110 and a GIP driver GIP-DP is located to be closer to a display area DA than the gate link unit G-Link is. When the GIP driver GIP-DP is implemented as a thin film transistor which is formed on the first substrate 110, similarly to the exemplary embodiments of this disclosure, the gate link unit G_Link and the GIP driver GIP-DP are formed on the first substrate 110. Further, simultaneously, a connection line CL which transmits a signal, which is applied from the plurality of signal transmission lines formed in the gate link unit G_Link, to the GIP driver GIP-DP is formed. The connection line CL may be located between the gate link unit G_Link and the GIP driver GIP-DP or formed over two areas.

As illustrated in FIG. 3, the connection line CL extends to the GIP driver GIP-DP side across the plurality of signal transmission lines. Therefore, the signal transmission line and the connection line CL of the gate link unit G_Link are configured by different conductive layers and an insulating layer is interposed between the conductive layers on which the signal transmission line and the connection line CL are formed. Therefore, the connection line CL may be selectively connected to the signal transmission line and extend to the GIP driver GIP-DP across the other signal transmission lines. A plurality of bridge areas BRA is equipped in the display panel 100 to electrically connect two different conductive layers.

For convenience in explanation, FIG. 4A illustrates a connection structure of one of the plurality of signal transmission lines and the connection line CL described above. Referring to FIG. 4A, the signal transmission line is formed by a first conductive layer M1, the connection line CL is formed by a second conductive layer M2, and one or more insulating layers are interposed between the signal transmission line and the connection line CL. For example, the signal transmission line is formed by a metal layer (gate metal) which forms a gate electrode 131 of a thin film transistor 130 formed on the first substrate 110. The connection line CL may be formed by a metal layer (S/D metal) which forms a source/drain electrode of the thin film transistor 130. In contrast, the signal transmission line may be formed by a metal layer (S/D metal) which forms the source/drain electrode of the thin film transistor 130 formed on the first substrate 110. The connection line CL may be formed by the metal layer (gate metal) which forms the gate electrode of the thin film transistor 130. In this case, a gate insulating layer (gate insulation: GI) may be interposed between the signal transmission line and the connection line CL.

Further, the signal transmission line may be formed by the same conductive layer as the gate line GL and the connection line CL may be formed by the same conductive layer as the data line DL. One or more insulating layers may be interposed between the signal transmission line and the connection line CL. In contrast, the signal transmission line may be formed by the same conductive layer as the data line DL and the connection line CL may be formed by the same conductive layer as the gate line GL. In this case, the same insulating layer as the insulating layer which is interposed between the gate line GL and the data line DL in the display area DA may be interposed between the signal transmission line and the connection line CL.

At least one insulating layer may be equipped above the signal transmission line and the connection line CL. For example, as illustrated in FIG. 4A, a passivation layer PAS and a flattening layer 122 may be formed above the signal transmission line and the connection line CL. As described above, in order to electrically connect the signal transmission line and the connection line CL which are formed by different conductive layers, a first contact area in which the signal transmission line and the connection line CL are connected is formed in the insulating layers above the signal transmission line and the connection line CL. First and second contact holes H1 and H2 are formed in the first contact area. The contact holes expose contact areas of the signal transmission line and the connection line CL. In the first contact hole H1 of the first contact area in which a part of the signal transmission line is located and the second contact hole H2 of the first contact area in which a part of the connection line CL is located, a bridge pattern BRP is formed to electrically connect the signal transmission line and the connection line CL. The bridge pattern BRP is formed on the contact holes H1 and H2 which expose the first contact area in which parts of the first conductive layer M1 and the second conductive layer M2 are located. The area which electrically connects the first conductive layer M1 and the second conductive layer M2 is referred to as a bridge area BRA.

That is, in the non-display area, a plurality of bridge patterns BRP which is in simultaneously contact with the first conductive layer M1 and the second conductive layer M2 which form the signal transmission line and the connection line CL located therebelow, respectively, through the contact holes of the insulating layer which covers the signal transmission line and the connection line CL is formed.

Similarly, a signal input terminal S_In at each stage ST of the GIP driver GIP-DP may be formed by a different conductive layer from the connection line CL.

The GIP driver GIP-DP equips a plurality of thin film transistors TFT including a gate electrode, an active layer, and a source/drain electrode. The thin film transistor is configured such that a gate driving signal applied by the signal transmission line is sequentially output to a plurality of gate lines located in the display area. A signal input terminal S-In of each stage ST of the GIP driver GIP-DP may correspond to a gate electrode of the thin film transistor.

Any one of the plurality of the signal transmission line may be formed of the same material as the gate electrode of the thin film transistor. Therefore, the first conductive layer M1 may be the same metal layer as the gate electrode of the thin film transistor.

Any one of the plurality of connection lines CL may be formed of the same material as the source/drain electrode of the thin film transistor. Therefore, the second conductive layer M2 may be the same metal layer as the source/drain electrode of the thin film transistor.

The bridge pattern BRP may be formed such that any one of the plurality of signal transmission lines formed of the same material as the gate electrode is connected to any one of the plurality of connection lines formed of the same material as the source/drain electrode.

As illustrated in FIG. 4A, a signal input terminal S_In of the GIP driver GIP-DP may be formed by the same conductive layer as the conductive layer which forms the signal transmission line. In this case, in order to electrically connect the signal input terminal S-In of the GIP driver GIP-DP and the connection line CL which are formed by different conductive layers, on an insulating layer above the connection line CL and the signal input terminal S-In of the GIP driver GIP-DP, a second contact area in which the signal input terminal S-In of the GIP driver GIP-DP and the connection line CL are connected is formed. Third and fourth contact holes H3 and H4 are formed in the second contact area. A bridge pattern BRP is formed in the third contact hole H3 of the second contact area in which a part of the connection line CL is located and the fourth contact hole H4 of the second contact area in which a part of the signal input terminal S_In of the GIP driver GIP-DP is located to electrically connect the signal input terminal S-In of the GIP driver GIP-DP and the connection line CL. Therefore, on the insulating layer which covers the connection line CL and the signal input terminal S-In of the GIP driver GIP-DP, the third contact hole which exposes a part of the connection line CL and the fourth contact hole which exposes a part of the signal input terminal S-In of the GIP driver GIP-DP are formed.

The area in which a bridge pattern BRP is formed on the contact holes H3 and H4 exposing the second contact area to electrically connect the first conductive layer M1 and the second conductive layer M2 is referred to as a bridge area BRA The contact area of the connection line CL located at the GIP driver GIP-DP side and the contact area of the signal input terminal S_In of the GIP driver GIP-DP are also connected to each other by the same structure as the bridge area BRA which connects the connection line CL and the signal transmission line. Therefore, the signal applied from the signal transmission line is transmitted to the GIP driver GIP-DP.

Further, as illustrated in FIG. 1, the data link line D_LL transmits a signal applied from the driving circuit unit to the data driver or transmits the data signal which is output from the data driver which is equipped in the data pad unit D_Pad in a COG manner to the data line DL disposed in the display area DA. The data link lines D_LL may be also electrically connected through the bridge pattern BRP formed above the corresponding contact holes, similarly to the connection line CL formed between the signal transmission line and the GIP driver GIP-DP.

The data link line D_LL may be a data signal transmission line which transmits a signal to the data line DL located in the display area DA.

Therefore, a plurality of bridge areas BRA may be equipped in peripheral areas of the gate link unit G_Link and the GIP driver GIP-DP. Further, a plurality of bridge areas BRA may be also formed in the non-display area NDA other than the peripheral areas of the gate link unit G_Link and the GIP driver GIP-DP. For example, the above-described bridge area BRA may be applied to the pad unit PAD illustrated in FIG. 1.

As described above, in order to implement smaller bezel width and reinforce an adhesiveness of the first substrate 110 and the second substrate 115, the seal area may be designed to overlap the gate link unit G_Link formed in the non-display area NDA and further overlap a portion where the GIP driver GIP-DP is formed. In this case, the sealant may be applied on some of bridge areas BRA. However, the bridge pattern BRP formed in the bridge area BRA may be formed of a material which has a poor adhesiveness to the sealant. For example, the bridge pattern BRP which is formed of ITO has a bad adhesiveness to the sealant and may be easily cracked by an external force which is transmitted through a hardened sealant. As a result, even though the sealant is equipped to extend to the part of the GIP driver GIP-DP, a bonding problem of the first substrate 110 and the second substrate 115 may be caused by a weakened adhesiveness between the sealant and the bridge pattern BRP. Further, when the bridge pattern BRP which overlaps the sealant is cracked, external material enters through the cracked portion to cause electro-chemical corrosion/corrosion of the wiring lines which are formed of a metal layer below the bridge electrode BRL.

Therefore, in the display panel 100 according to the exemplary embodiments of the present disclosure, a shield pattern SHP formed of the same material as the plurality of lower spacers L_SP formed in the display area DA of the first substrate 110 is formed in a position corresponding to the bridge area BRA of the non-display area NDA. In other words, the shield pattern SHP is formed to cover the bridge pattern BRP located in the non-display area NDA. One shield pattern SHP disposed on the bridge area BRA may be formed to cover one bridge pattern BRP, as illustrated in FIGS. 3 and 4A. In FIG. 4A, the shield pattern SHP which covers an upper portion of the bridge pattern BRP which electrically connects the signal transmission line and the connection line is formed to fill the contact holes H1 and H2, which allows the bridge pattern BRP to be in contact with the first contact area. Similarly, the shield pattern SHP is also formed above the bridge pattern BRP which electrically connects the connection line CL and the signal input terminal S_In of the GIP driver GIP-DP to fill the contact holes H3 and H4 as the same manner as the opposite bridge area BRA.

Further, the bridge pattern BRP may be formed to electrically connect the data signal transmission line illustrated in FIG. 1, which transmits the data signal output from the data driver to the data line DL disposed in the display area DA, to the data line DL, similarly to the connection line CL formed between the signal transmission line and the GIP driver GIP-DP. A third contact area in which the data signal transmission line and the data line DL are in contact with each other by the bridge pattern BRP may be equipped.

The third contact area in which contact holes through which the data signal transmission line and the data line DL are in contact with each other are located may be formed at both ends of the bridge pattern BRP.

Referring to FIG. 4A, the shield pattern SHP which is disposed above the bridge pattern BRP is formed of the same material through the same process as the lower spacer L_SP which is disposed in the display area DA to correspond to the upper spacer U_SP. Accordingly, the shield pattern SHP disposed in the bridge area BRA and the lower spacer L_SP disposed in the display area DA may have the same height. However, structures formed between the first substrate 110 and the second substrate 115 may be different from each other between the display area DA and the non-display area NDA. Therefore, the shield pattern SHP disposed in the bridge area BRA and the lower spacer L_SP disposed in the display area DA may be formed to have different heights, if necessary. For example, the shield pattern SHP which is formed in the bridge area BRA, that is, in the non-display area NDA may affect the cell gap between the first substrate 110 and the second substrate 115. Therefore, the shield pattern SHP formed above the bridge area BRA may be formed to be lower than the lower spacer L_SP formed in the display area DA. As another example, in order to protect the bridge area BRA, the shield pattern SHP which covers the bridge area BRA may be desirably formed to be higher. In order to make a height of the shield pattern SHP of the bridge area BRA and a height of the lower spacer L_SP of the display area DA be different from each other, a shield pattern SHP or a lower spacer L_SP which is formed in one area of the two areas may be formed to be higher or lower than a shield pattern SHP or a lower spacer L_SP of the other area, using a half-tone mask.

FIG. 4A illustrates that all the shield patterns SHP which cover the bridge pattern BRP of the bridge area BRA are covered with the sealant. However, as described above, the seal area may partially overlap the gate link unit G_Link and the remaining gate link unit G_Link may not overlap the seal area. Further, even though the seal area overlaps the entire area of the gate link unit G_Link, a part of the bridge area BRA equipped in the GIP driver GIP-DP area may be located to be apart from the seal area. As described above, the bridge area BRA may be equipped even in a portion which does not overlap the seal area and the shield pattern SHP may be also equipped on the bridge area BRA which does not overlap the seal area.

As illustrated in FIG. 4A, when the shield pattern SHP is locally formed in each bridge area BRA located below the sealant, a stain may be generated around the seal area by a step of the shield pattern SHP. In order to reduce the step by the shield pattern SHP in the seal area, one shield pattern SHP may be disposed to cover the plurality of bridge areas BRA.

Further, referring to FIG. 4A, an upper spacer U-SP and a lower spacer L_SP may be located on an upper substrate and a lower substrate disposed to be opposite to each other to interpose liquid crystal therebetween. In this case, the upper spacer U-SP may be a shield pattern SHP which covers the bridge pattern BRP of the bridge area BRA.

In each of a plurality of bridge areas BRA, a bridge pattern BRP which is disposed on a first contact hole H1 through which a first metal layer M1 is exposed and a second contact hole H2 through which a second metal layer M2 is exposed to connect the first metal layer M1 and the second metal layer M2 through the first contact hole H1 and the second contact hole H2 may be equipped.

A part of the lower spacer L_SP may be disposed in a position corresponding to the upper spacer U_SP and another part of the lower spacer L_SP may be disposed to overlaps at least one bridge area among the plurality of bridge areas BRA.

The first metal layer M1 is a gate metal layer, the second metal layer M2 is a source/drain metal layer and the bridge pattern BRP is formed of ITO.

At least one bridge area among the plurality of bridge areas is located in the seal area.

The lower spacer L_SP equipped on the lower substrate and the upper spacer U_SP equipped on the upper substrate may be configured by the same material.

The spacer may be configured by polyimide (PI) or photo-acryl (PAC).

Further, the shield pattern SHP which covers the bridge pattern BRP of the bridge area BRA according to the exemplary embodiment of the present disclosure may be a bank pattern which divides the plurality of pixels in an organic light emitting display device in which a plurality of pixels equipped with an organic light emitting device is disposed.

Figure 4B:
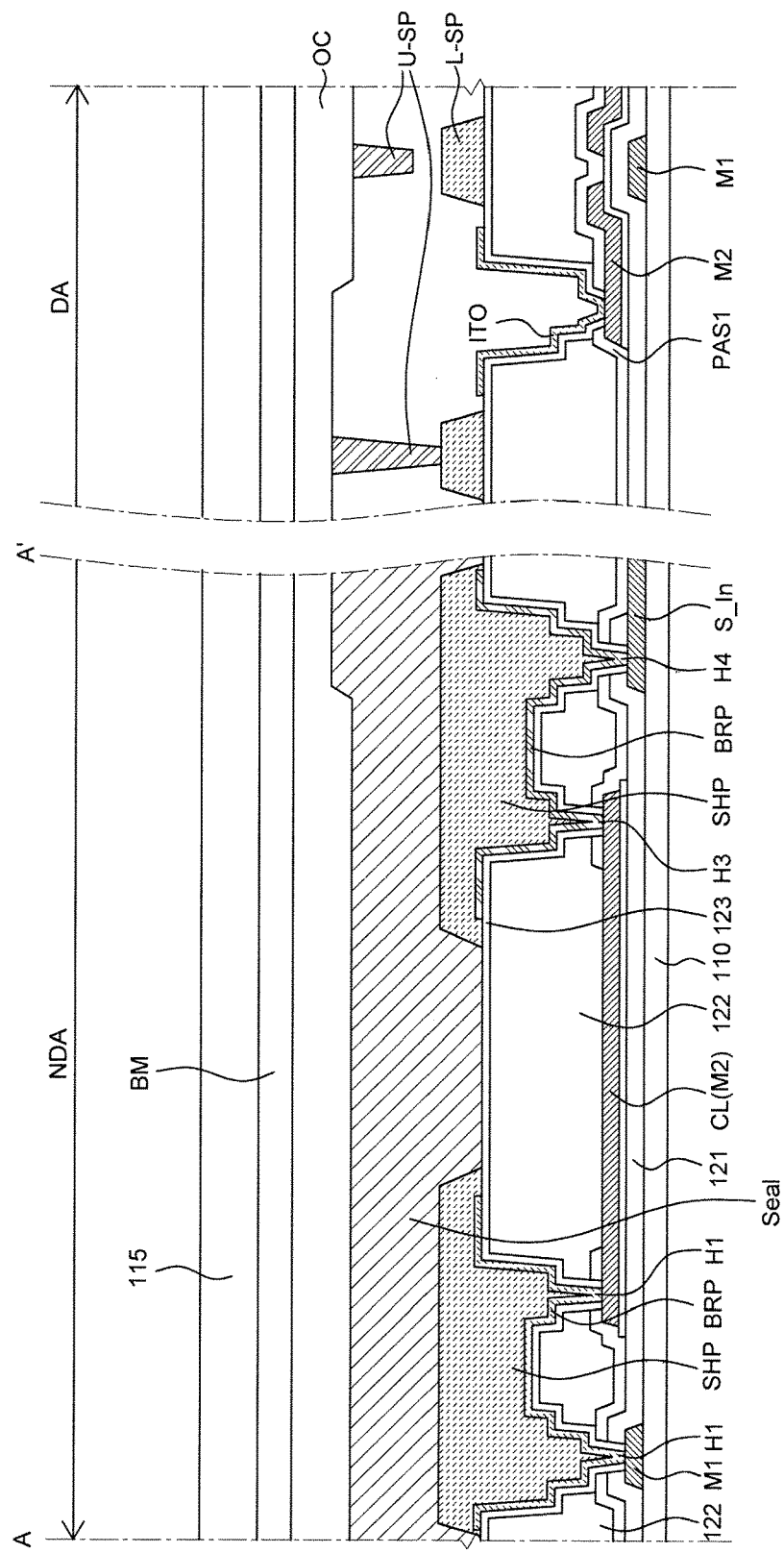
FIG. 4B is a cross-sectional view taken along the line A-A' of FIG. 3 according to another exemplary embodiment of the present disclosure.

FIG. 4B is a view illustrating a cross-section taken along the line extending from A to A' illustrated in FIG. 3, according to another exemplary embodiment of the present disclosure.

FIG. 4B is a cross-sectional view schematically illustrating a display panel 100 which is equipped with a shield pattern SHP disposed to cover a plurality of bridge areas BRA, according to another exemplary embodiment of the present disclosure. Referring to FIG. 4B, a bridge pattern BRP which connects the signal transmission line and the connection line CL and a bridge area BRA which connects the connection line CL and the signal input terminal S_In of the GIP driver GIP-DP are covered by one shield pattern SHP. As described above, the shield pattern SHP is formed to cover a plurality of bridge patterns BRP, thereby reducing the step caused by the shield pattern SHP disposed below the sealant.

The shield pattern SHP disposed in the non-display area NDA extend not only to two bridge patterns BRP located at both ends of the connection line CL but also to other bridge patterns BRP close thereto to cover two or more bridge areas BRA. The shield pattern SHP of the non-display area NDA may be formed to partially or entirely cover the gate link unit G_Link by the single pattern or partially or entirely formed on the GIP driver GIP-DP, in accordance with adhesiveness between a material which forms the shied pattern SHP and the sealant. Specifically, when the shield pattern SHP is formed of a material which has a better adhesiveness to the sealant better than the bridge electrode BRL formed of ITO instead of the shield pattern SHP which locally covers the bridge pattern BRP, a shield pattern SHP having a single pattern which has a predetermined area in proportional to the area of the seal area is disposed over the gate link unit G_Link and the GIP driver GIP-DP. In this case, it is more advantageous to bond the first substrate 110 and the second substrate 115 and protect the bridge pattern BRP. As a material for the shield pattern SHP, photo acryl (PAC) or polyimide (PI) may be used.

In the exemplary embodiments of the present disclosure which have been described with reference to the drawings, in an area where the seal area overlaps the gate link unit G_Link, the connection line, and the GIP driver GIP-DP disposed in the non-display area NDA, the sealant has improved adhesiveness as compared with the structure of the related art. Therefore, a bonding problem of the first substrate 110 and the second substrate 115 is reduced and the bezel width of the display device may be reduced to a predetermined level or lower.

Further, the electro-chemical corrosion/corrosion of the first metal layer M1 and the second metal layer M2 caused by the damaged bridge pattern BRP below the sealant, in a region where the seal area and the non-display area NDA overlap, is suppressed, to provide an enhanced display panel 100.

Furthermore, in order to reduce the bezel width of the display device, a display panel 100 having a high degree of design/process freedom may be provided by reducing a bonding problem of the first substrate 110 and the second substrate 115 and the electro-chemical corrosion/corrosion of the wiring lines without additional avoidance design of the seal area and the bridge area BRA and additional separate process or a new mask.

The exemplary embodiments of the present disclosure can also be described as follows:

According to an aspect of the present disclosure, a display device includes a lower substrate in which a display area and a non-display area are divided; an upper substrate which corresponds to the lower substrate and includes a black matrix BM; a bezel which is located on the non-display area and includes a GIP driver, a plurality of signal transmission lines, a connection line connecting the GIP driver and the plurality of signal transmission lines, and a seal area equipped with a sealant, in a direction being apart from one side of the display area; a plurality of bridge patterns which is located on the non-display area and electrically connects the GIP driver and the connection line, and the connection line and the plurality of signal transmission lines, respectively; and a plurality of shield patterns enclosing the plurality of bridge patterns. Herein, the plurality of shield patterns minimizes an area in which the sealant and the plurality of bridge patterns are in directly contact with each other.

In the seal area, the sealant may bond the lower substrate and the upper substrate to each other.

The sealant may locally overlap the signal transmission line to minimize an area of the bezel.

The GIP driver may include a plurality of thin film transistor TFT including a gate electrode, an active layer, and a source electrode and a drain electrode and the thin film transistors may be configured to sequentially output a gate driving signal applied by the plurality of signal transmission lines to a plurality of gate lines located in the display area.

Any one of the plurality of signal transmission lines may be configured by the same material as the gate electrode of the thin film transistor.

Any one of the plurality of connection lines may be configured by the same material as the source electrode or the drain electrode of the thin film transistor.

The plurality of bridge patterns may be disposed to connect any one of the plurality of signal transmission lines configured by the same material as the gate electrode and any one of the plurality of connection lines configured by the same material as the source electrode or the drain electrode.

A first contact area may be equipped at both ends of the bridge pattern to connect the signal transmission line and the connection line.

A part of the first contact area may be disposed in the seal area.

The bridge pattern may be configured by indium tin oxide (ITO).

The shield pattern may be disposed to cover the first contact area.

An adhesiveness between the shield pattern and the sealant may be larger than an adhesiveness between the sealant and the bridge pattern.

The plurality of shield patterns may be configured by polyimide (PI) or photo-acryl (PAC).

The bridge pattern may connect any one of the plurality of connection lines and the gate electrode of the thin film transistor.

A second contact area may be equipped at both ends of the bridge pattern to connect the signal transmission line and the thin film transistor.

A part of the second contact area may be disposed in the seal area.

The display device may further include a plurality of data signal transmission lines which is located in the non-display area and transmits a data signal input from the outside to the data line in the display area.

Any one of the plurality of data signal transmission lines may be configured by the same material as the gate electrode of the thin film transistor.

Any one of the plurality of data signal transmission lines configured by the same material as the gate electrode may be electrically connected to the data line through the bridge pattern.

A third contact area which is in contact with the data signal transmission line and the data line may be equipped at both ends of the bridge pattern.

According to another aspect of the present disclosure, a liquid crystal display device includes an upper substrate and a lower substrate which are disposed opposite to each other to interpose liquid crystal therebetween, a plurality of upper spacers which is equipped on the upper substrate, a plurality of lower spacers equipped on the lower substrate, a gate link unit in which a plurality of external signal lines is disposed, a GIP driver which is equipped with a shift register, a plurality of bridge areas which electrically connects the plurality of external signal lines and the GIP driver, a sealant equipped in a seal area which overlaps the gate link unit and a part of a GIP driver, and a bridge pattern which is disposed on a first contact hole through which a first metal layer is exposed and a second contact hole through which a second metal layer is exposed to connect the first metal layer and the second metal layer through the first contact hole and the second contact hole, in each of the plurality of bridge areas. Herein, some of the plurality of lower spacers may be disposed in a position corresponding to the upper spacer the other of the plurality of the lower spacers may be disposed to overlaps at least one bridge area among the plurality of bridge areas.

The seal area may at least partially overlap the gate link unit or the GIP driver.

The first metal layer may be a gate metal layer, the second metal layer may be a source/drain metal layer, and the bridge electrode may be formed of ITO.

At least one of the plurality of bridge areas may be located in the seal area.

The lower spacer equipped on the lower substrate and the upper spacer equipped on the upper substrate may be configured by the same material.

The lower spacer equipped on the lower substrate and the upper spacer equipped on the upper substrate may be configured by different materials and the spacer equipped on the lower substrate may be configured by polyimide (PI) or photo-acryl (PAC).

According to yet another aspect of the present disclosure, an organic light emitting display device includes a substrate including a display areas in which a plurality of pixels equipped with an organic light emitting device is disposed and a non-display area, a bezel which is located on the non-display area and includes a GIP driver, a plurality of signal transmission lines, a connection line connecting the GIP driver and the plurality of signal transmission lines, and a seal area equipped with a sealant, in a direction being apart from one side of the display area, a plurality of bridge patterns which is located on the non-display area and electrically connects the GIP driver and the connection line, and the connection line and the plurality of signal transmission lines, respectively, and a plurality of shield patterns enclosing the plurality of bridge patterns.

The organic light emitting display device may further include a bank pattern which divides a plurality of pixel areas in the display area.

The shield pattern may be configured by the same material as the bank pattern.

The shield pattern may be configured to partially cover the plurality of signal transmission lines, the connection line, and the GIP driver, respectively.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
a lower substrate having a display area and a non-display area;
an upper substrate corresponding to the lower substrate and including a black matrix (BM);
a bezel located on the non-display area and including a GIP driver, a plurality of signal transmission lines, a connection line connecting the GIP driver and the plurality of signal transmission lines, and a seal area having a sealant, in a direction being apart from one side of the display area;
a plurality of bridge patterns located on the non-display area and electrically connects the GIP driver and the connection line, and the connection line and the plurality of signal transmission lines, respectively; and
a plurality of shield patterns enclosing the plurality of bridge patterns,
wherein the plurality of shield patterns reduces an area in which the sealant and the plurality of bridge patterns are in directly contact with each other.

2. The display device according to claim 1, wherein the sealant partially overlaps the plurality of signal transmission lines to reduce an area of the bezel.

3. The display device according to claim 2, wherein the sealant overlaps the plurality of signal transmission lines of a gate link unit, the connection line and a part of the GIP driver.

4. The display device according to claim 1, wherein the GIP driver includes a plurality of thin film transistors (TFTs) including a gate electrode, an active layer, and a source electrode and a drain electrode and the thin film transistors are configured to sequentially output a gate driving signal applied by the plurality of signal transmission lines to a plurality of gate lines located in the display area.

5. The display device according to claim 4, wherein any one of the plurality of signal transmission lines is configured by the same material as the gate electrode of the thin film transistor.

6. The display device according to claim 4, wherein any one of the plurality of connection lines is configured by the same material as the source electrode or the drain electrode of the thin film transistor.

7. The display device according to claim 6, wherein the plurality of bridge patterns is disposed to connect at least one of the plurality of signal transmission lines configured by the same material as the gate electrode and at least one of the plurality of connection lines configured by the same material as the source electrode or the drain electrode.

8. The display device according to claim 4, wherein a first contact area is equipped at both ends of one of the plurality of bridge patterns to connect one of the plurality of signal transmission lines and the connection line.

9. The display device according to claim 8, wherein a part of the first contact area is disposed in the seal area.

10. The display device according to claim 1, wherein the plurality of bridge patterns is configured by indium tin oxide (ITO).

11. The display device according to claim 8, wherein one of the plurality of shield patterns is disposed to cover the first contact area.

12. The display device according to claim 1, wherein an adhesiveness between the plurality of shield patterns and the sealant is larger than an adhesiveness between the sealant and the plurality of bridge patterns.

13. The display device according to claim 1, wherein the plurality of shield patterns is configured by polyimide (PI) or photo-acryl (PAC).

14. The display device according to claim 6, wherein the plurality of bridge patterns connects at least one of the plurality of connection lines and the gate electrode of the thin film transistor.

15. The display device according to claim 8, wherein a second contact area is equipped at both ends of the other one of the plurality of bridge patterns to connect one of the plurality of signal transmission lines and one of the plurality of thin film transistors.

16. The display device according to claim 15, wherein a part of the second contact area is disposed in the seal area.

17. The display device according to claim 1, further comprising:
a plurality of data signal transmission lines located in the non-display area and transmits a data signal input from the outside to a data line in the display area.

18. The display device according to claim 17, wherein at least one of the plurality of data signal transmission lines is configured by the same material as the gate electrode of the thin film transistor.

19. The display device according to claim 18, wherein at least one of the plurality of data signal transmission lines configured by the same material as the gate electrode is electrically connected to the data line through one of the plurality of bridge patterns.

20. The display device according to claim 17, wherein a third contact area which is in contact with one of the plurality of data signal transmission lines and the data line is equipped at both ends of one of the plurality of bridge patterns.

21. A liquid crystal display device comprising:
an upper substrate and a lower substrate disposed opposite to each other to interpose liquid crystal therebetween;
a plurality of upper spacers on the upper substrate;
a plurality of lower spacers on the lower substrate;
a gate link unit in which a plurality of external signal lines is disposed;
a GIP driver equipped with a shift register;
a plurality of bridge areas electrically connecting the plurality of external signal lines and the GIP driver;
a sealant equipped in a seal area overlapping the gate link unit and a part of a GIP driver; and
a bridge pattern disposed on a first contact hole through which a first metal layer is exposed and a second contact hole through which a second metal layer is exposed to connect the first metal layer and the second metal layer through the first contact hole and the second contact hole, in each of the plurality of bridge areas,
wherein some of the plurality of lower spacers are disposed in a position corresponding to the plurality of upper spacers and the other of the plurality of lower spacers are disposed to overlap at least one bridge area among the plurality of bridge areas.

22. The liquid crystal display device according to claim 21, wherein the seal area at least partially overlaps the gate link unit or the GIP driver.

23. The liquid crystal display device according to claim 21, wherein the first metal layer is a gate metal layer, the second metal layer is a source/drain metal layer, and the bridge electrode is formed of ITO.

24. The liquid crystal display device according to claim 21, wherein at least one of the plurality of bridge areas is located in the seal area.

25. The liquid crystal display device according to claim 21, wherein the plurality of lower spacers on the lower substrate and the plurality of upper spacers on the upper substrate are configured by the same material.

26. The liquid crystal display device according to claim 21, wherein the plurality of lower spacers on the lower substrate and the plurality of upper spacers on the upper substrate are configured by different materials and the plurality of lower spacers on the lower substrate is configured by polyimide (PI) or photo-acryl (PAC).

27. An organic light emitting display device, comprising:
a substrate including a display areas in which a plurality of pixels equipped with an organic light emitting device is disposed and a non-display area;
a bezel which is located on the non-display area and includes a GIP driver, a plurality of signal transmission lines, a connection line connecting the GIP driver and the plurality of signal transmission lines, and a seal area equipped with a sealant, in a direction being apart from one side of the display area;
a plurality of bridge patterns which is located on the non-display area and electrically connects the GIP driver and the connection line, and the connection line and the plurality of signal transmission lines, respectively; and
a plurality of shield patterns enclosing the plurality of bridge patterns.

28. The organic light emitting display device according to claim 27, further comprising:
a bank pattern which divides a plurality of pixel areas in the display area.

29. The organic light emitting display device according to claim 28, wherein the shield pattern is configured by the same material as the bank pattern.

30. The organic light emitting display device according to claim 27, wherein the shield pattern is configured to partially cover the plurality of signal transmission lines, the connection line, and the GIP driver, respectively.

* * * * *